(12) United States Patent
Hashimoto

(10) Patent No.: US 6,383,840 B1
(45) Date of Patent: May 7, 2002

(54) SEMICONDUCTOR DEVICE, METHOD OF MANUFACTURE THEREOF, CIRCUIT BOARD, AND ELECTRONIC DEVICE

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/787,736

(22) PCT Filed: Jul. 21, 2000

(86) PCT No.: PCT/JP00/04885

§ 371 Date: Mar. 22, 2001

§ 102(e) Date: Mar. 22, 2001

(87) PCT Pub. No.: WO01/08222

PCT Pub. Date: Feb. 1, 2001

(30) Foreign Application Priority Data

Jul. 22, 1999 (JP) ............................................. 11-207906

(51) Int. Cl.[7] .................. H01L 21/44; H01L 21/48; H01L 21/50; H01L 23/48; H01L 23/52; H01L 29/40

(52) U.S. Cl. .................... 438/109; 438/611; 257/696; 257/777

(58) Field of Search ................................. 438/109, 611; 257/696, 777

(56) References Cited

U.S. PATENT DOCUMENTS

| 4,982,265 A | | 1/1991 | Watanabe et al. | |
|---|---|---|---|---|
| 5,744,827 A | * | 4/1998 | Jeong et al. | 257/686 |
| 5,895,969 A | * | 4/1999 | Masuda et al. | 257/696 |

FOREIGN PATENT DOCUMENTS

| JP | 64-71162 | 3/1989 |
|---|---|---|
| JP | 2870530 | 1/1999 |
| JP | 2944449 | 6/1999 |

* cited by examiner

Primary Examiner—Charles Bowers
Assistant Examiner—Nema Berezny
(74) Attorney, Agent, or Firm—Oliff & Berridge, PLC

(57) ABSTRACT

A semiconductor device comprises a plurality of substrates (10) disposed to be stacked one another and having interconnect patterns (12) formed on the substrates, and semiconductor chips (20) mounted on the substrates (10). The interconnect pattern (12) has a bent portion (16) projecting from a surface of the substrate (10). The bent portions (16) are stacked one another and electrically connected.

20 Claims, 14 Drawing Sheets

SEMICONDUCTOR DEVICE, METHOD OF MANUFACTURE THEREOF, CIRCUIT BOARD, AND ELECTRONIC DEVICE

FIELD OF THE INVENTION

The present invention relates to a semiconductor device and method of manufacture thereof, a circuit board, and an electronic instrument.

BACKGROUND OF ART

Conventionally, as a semiconductor device is known one having a substrate (interposer) on which an interconnect pattern is formed, with a semiconductor chip mounted on the interposer. With the miniaturization and increasing pin count of semiconductor devices, even finer interconnect patterns are required, but there is a limit to the degree to which an interconnect pattern formed on a single interposer can be made finer. Moreover, a multilayer substrate is expensive.

By using a plurality of interposers, higher pin counts can be supported. For example, a stack type of semiconductor device has been developed, having a construction in which a plurality of interposers is adhered together, with a semiconductor chip mounted on one surface or both surfaces.

As a published example, Japanese Patent Publication number 2870530 discloses interconnect patterns formed on upper and lower interposers connected together electrically by bumps. However, by reason of this, there is the problem that the formation of bumps takes time and incurs a cost.

The present invention is made so as to solve the above problem, and has as its object the provision of a semiconductor device having a simple construction and having substrates electrically connected and a method of manufacture thereof, a circuit board, and an electronic instrument.

DISCLOSURE OF THE INVENTION (1) A semiconductor device of the present invention comprises:

a plurality of substrates disposed to be stacked one another, an interconnect pattern being formed on each of the substrates; and a semiconductor chip mounted on at least one of the substrates, wherein the interconnect pattern has a bent portion projecting from a surface of each of the substrates, and wherein two or more the bent portions are provided on two or more the substrates respectively, the two or more the bent portions being stacked one another and electrically connected.

According to the present invention, the bent portion is formed as a part of the interconnect pattern projecting from the surface of the substrate, and is of a simple construction. Since electrical connection between the two or more the substrates is achieved by means of the bent portions, it is not necessary to form bumps.

(2) In this semiconductor device:

a projecting surface of one of the bent portions and a depressed surface of another of the bent portions may be facing each other and electrically connected.

(3) In this semiconductor device:

the projecting surface of the one of the bent portions may enter an interior of the depressed surface of the other of the bent portions.

By means of this, the projecting surface of the one bent portion enters inside the depressed surface of the other bent portions, whereby both are accurately positioned. In accordance with the positioning of the bent portions, the substrates are also accurately positioned.

(4) In this semiconductor device:

the interior of the depressed surface of the other of the bent portions may be filled with a conductive material.

By means of this, the projecting surface of the one bent portion and the depressed surface of the other bent portion can be electrically connected by the conductive material.

(5) In this semiconductor device:

the projecting surfaces of two of the bent portions may be facing each other and electrically connected.

By means of this, the projecting sides of the bent portions are electrically connected together, as a result of which a wide spacing between the pair of substrates on which the two are provided can be obtained.

(6) In this semiconductor device:

the two or more of the bent portions, which are stacked each other and electrically connected, may have substantially the same shape.

(7) In this semiconductor device:

a penetrating hole may be formed in one of the substrates, and at least one of the bent portions may enter the penetrating hole, and the one of the bent portions entering the penetrating hole may be a part of the interconnect pattern formed on the substrate having the penetrating hole.

By means of this, the interconnect pattern is formed on the side of the substrate opposite to that on which the bent portion projects. As a result, one of the substrates intervenes between a pair of electrically connected interconnect patterns. Therefore a short-circuit between the two can be prevented.

(8) In this semiconductor device:

in one of the substrates, penetrating holes may be formed, and at least one of the bent portions may be formed over the penetrating hole without entering the penetrating hole, and the one of the bent portions positioned over the penetrating hole may be a part of the interconnect pattern formed on the substrate having the penetrating holes.

By means of this, because the bent portion projects on the side of the substrate on which the interconnect pattern is formed, the bent portion can be formed higher from the surface of the substrate.

(9) In this semiconductor device:

two or more the bent portions may be formed over the penetrating hole.

By means of this, for two or more bent portions only one penetrating hole need to be formed.

(10) In this semiconductor device:

two or more the penetrating holes may be formed in one of the substrates, two or more the bent portions may be formed on the interconnect pattern formed on the one of the substrates having the two or more the penetrating holes, and one of the bent portions may be formed over one of the penetrating holes.

By means of this, the material of the substrate intervenes between adjacent bent portions provided on one substrate. Therefore, a short-circuit between the bent portions can be prevented.

(11) A circuit board of the present invention has the above described semiconductor device mounted thereon.

(12) An electronic instrument of the present invention has the semiconductor device.

(13) A method of manufacturing a semiconductor device of the present invention comprises: mounting a semiconductor chip on at least one of a plurality of substrates, each on which an interconnect pattern is formed; disposing the substrates so as to stack one an other; and electrically connecting two or more the substrates, wherein the interconnect pattern has a bent portion projecting from a surface of each of the substrates, and wherein two or more the bent portions are provided on two or more the substrates respectively, the two or more the bent portions being stacked one another and electrically connected.

According to the present invention, the bent portions are formed as a part of the interconnect pattern projecting from the surface of the substrate, and are of a simple construction. Since electrical connection between two or more substrates is achieved by means of the bent portions, it is not necessary to form bumps.

(14) In this method of manufacturing a semiconductor device:

a projecting surface of one of the bent portions and a depressed surface of another of the bent portions may be facing each other and electrically connected.

(15) In this method of manufacturing a semiconductor device:

the projecting surface of the one of the bent portions may enter an interior of the depressed surface of the other of the bent portions.

By means of this, the projecting surface of the one bent portion enters inside the depressed surface of the other bent portion, whereby both can be accurately positioned. In accordance with the positioning of the bent portions, the substrates can also be accurately positioned.

(16) This method of manufacturing a semiconductor device may further comprise:

filling the interior of the depressed surface of the other of the bent portions with a conductive material.

By means of this, the projecting surface of the one bent portion and the depressed surface of the other bent portion can be electrically connected by the conductive material.

(17) In this method of manufacturing a semiconductor device:

the projecting surfaces of two of the bent portions may be facing each other and electrically connected.

By means of this, the projecting sides of the bent portions are electrically connected together, as a result of which a wide spacing between the pair of substrates on which the two are provided can be obtained.

(18) In this method of manufacturing a semiconductor device:

at least one of pressure and heat may be applied to the stacked two or more the bent portions for electrical connection.

By means of this, the electrical connection of the two or more bent portions can be carried out simply.

BEST MODE FOR CARRYING OUT THE INVENTION

The present invention is now described in terms of a number of embodiments, with reference to the drawings.

First Embodiment

Figure 1:
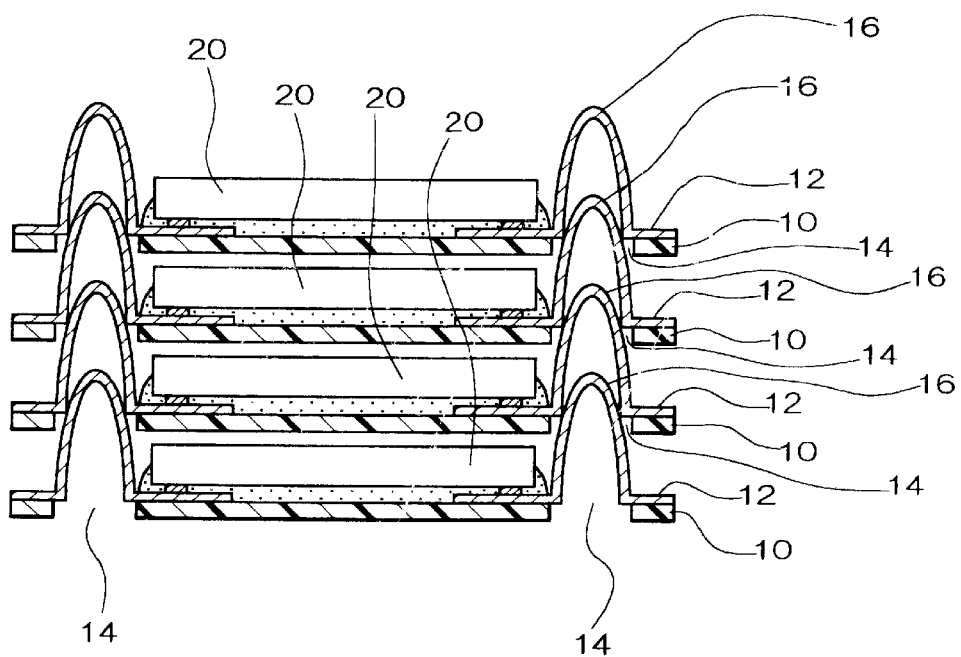
FIG. 1 shows a first embodiment of the semiconductor device to which the present invention is applied.

FIG. 1 shows a first embodiment of the semiconductor device to which the present invention is applied. The semiconductor device comprises a plurality of substrates 10. On the substrates 10 are formed interconnect patterns 12. With the interconnect pattern 12 formed, a substrate 10 can be termed an interconnect substrate. In this embodiment of the semiconductor device the substrates 10 are of the same construction, but the substrates 10 may be of different constructions.

The material of the substrate 10 may be an organic material, or may equally be an inorganic material. As an organic material may be used polyimide, polyester, polysulfone resins, or the like, and as an inorganic material may be used silicon, glass, ceramic, metal, or the like, and a combination of organic and inorganic materials may also be used.

As the substrate 10 may be cited a flexible substrate formed of a polyimide resin (such as for example a TAB tape (Tape automated Bonding Tape), a ceramic substrate, a glass substrate, and a glass epoxy substrate.

Figure 2:
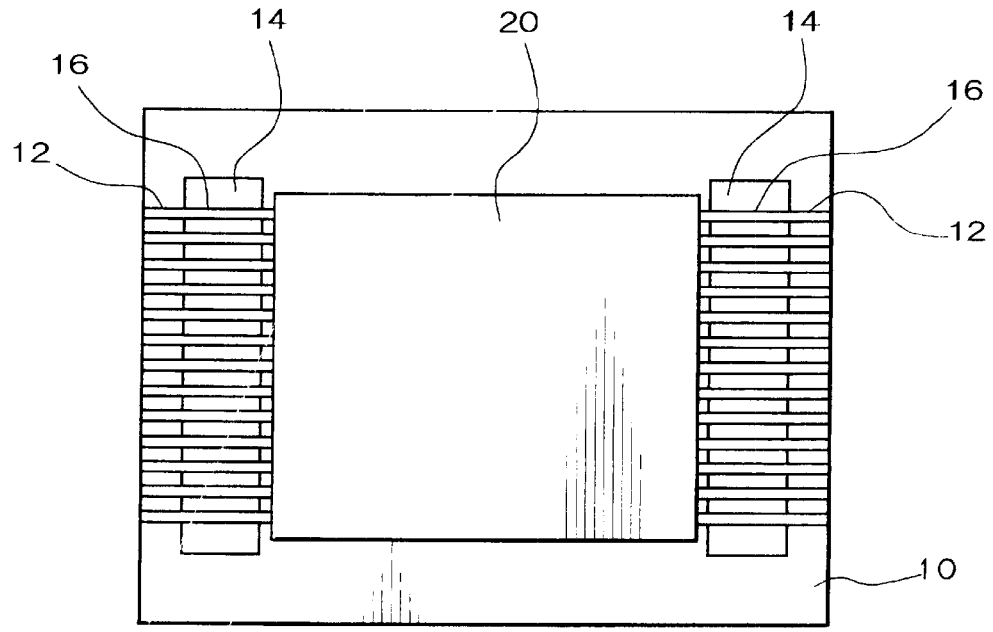
FIG. 2 shows a substrate of the first embodiment of the semiconductor device to which the present invention is applied.

In this embodiment, in the substrate 10 is formed at least one (one, or a plurality of) penetrating holes (or vias or openings) 14. The form of the penetrating holes 14 may be any of oblong, circular, elongated circular, or elliptical. FIG. 2 is a plan view of the substrate 10. The penetrating holes 14 are formed to avoid the mounting region of a semiconductor chip 20. One penetrating hole 14, as shown in FIG. 2, may be a long slot over which a plurality of bent portions 16 are formed, or may be of a size for only a single bent portion 16 to be formed over it.

The interconnect pattern 12 may be formed on one side of the substrate 10, or may be formed on both sides. The interconnect pattern 12 may have formed lands for connection to electrodes (pads) of the semiconductor chip 20. Except for the electrically connected portions (for example, lands, or bent portions 16), the interconnect pattern 12 is preferably covered with a protective layer of solder resist or the like.

The interconnect pattern 12 may be adhered by an adhesive (not shown in the drawings) to the substrate 10, constituting a three-layer substrate. In this case, the interconnect pattern 12 is commonly formed by etching a metal foil of copper foil or the like or a conductive foil. The metal foil of copper foil or the like or conductive foil is first adhered to the substrate 10 by an adhesive (not shown in the drawings).

The interconnect pattern 12 may be constructed of multiple layers. For example, after laminating a film of any of copper (Cu), chromium (Cr), titanium (Ti), nickel (Ni), or titanium-tungsten (Ti—W), this may be etched to form the interconnect pattern 12. For the etching, photolithography may be applied.

Alternatively, the interconnect pattern 12 may be formed on the substrate 10 without an adhesive, to constitute a two-layer substrate. In a two-layer substrate, a thin film is formed by sputtering or the like, and plating is carried out, to form the interconnect pattern 12. The interconnect pattern 12 may also be formed by the additive method. Even if a two-layer substrate, the interconnect pattern 12 has a thickness sufficient to allow plastic processing.

As the substrate 10 (interconnect substrates) on which the interconnect pattern 12 is formed may equally be employed a built-up interconnect board constructed from an insulating resin and interconnect pattern which are laminated, or a multilayer substrate in which a plurality of substrates are laminated, or a double-sided substrate or the like.

On the interconnect pattern 12 is formed at least one (one or a plurality of) bent portions 16. Linear portions (interconnects) of the interconnect pattern 12 are bent, forming the bent portions 16. The bent portions 16 project from the surface of the first substrate 10. The ends of the bent portions 16 are, in the example shown in FIG. 1, bent in a rounded form, but may be substantially flat. The bent portions 16 are formed by plastic deformation of a part of the first interconnect pattern 12. If the first interconnect pattern 12 is flexible, the bent portions 16 will also be flexible.

On at least one surface of the bent portion 16 shown in FIG. 1 (at least one of the projecting surface and depressed surface), to better ensure positive electrical conduction, plating is preferably carried out. For example, tin or solder plating may be applied, an oxidation resistant gold plating may be applied.

The bent portions 16 are formed to coincide with the penetrating holes 14. A plurality of (two or more) bent portions 16 is formed so as to coincide with a single penetrating hole 14. In this embodiment, the bent portions 16 do not enter the penetrating holes 14. In more detail, the bent portions 16 are formed over the penetrating holes 14 to project from the surface of the first substrate 10 on which the first interconnect pattern 12 is formed. The bent portions 16 positioned over the penetrating holes 14 are formed from the interconnect pattern 12 formed on the substrate 10 having the penetrating holes 16.

Figure 3:
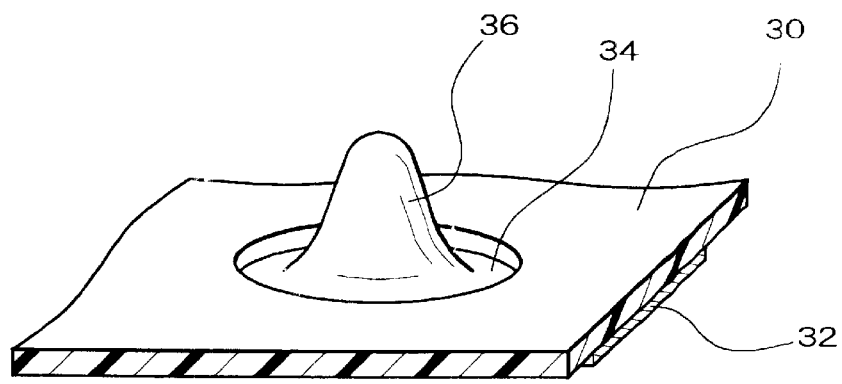
FIG. 3 shows a modification of the first embodiment.

As a modification, a bent portion 36 shown in FIG. 3 enters a penetrating hole 34 formed in a substrate 30. In other words, the bent portion 36 entering the penetrating hole 34 is formed from the interconnect pattern 32 formed on the substrate 30 in which the penetrating hole 34 is formed. The bent portion 36 projects from the surface opposite to the surface of the substrate 30 on which the interconnect pattern 32 is formed. Even when in the substrate 30 a plurality of (two or more) penetrating hole 34 is formed, and a plurality of (two or more) bent portions 36 is formed in the interconnect pattern 32, the formation is such that one bent portion 36 is formed over one penetrating hole 34. The bent portion 36 has a dome form. The bent portion 36 is formed by plastic deformation of the portion blocking the penetrating hole 34 in the interconnect pattern 32 (the portion larger than the penetrating hole 34). In the process of formation, provided it is within the limits of not interfering with electrical conduction, breaks (cracks) of the bent portion 36 may occur. It should be noted that if an adhesive is interposed between the substrate 30 and the interconnect pattern 32, when the bent portions 36 are formed, adhesive may be present between the penetrating hole 34 and the bent portion 36. By virtue of this, thermal stress applied to the bent portions 36 can be absorbed by the adhesive. The description of this embodiment can also be applied to this modification.

Figure 4:
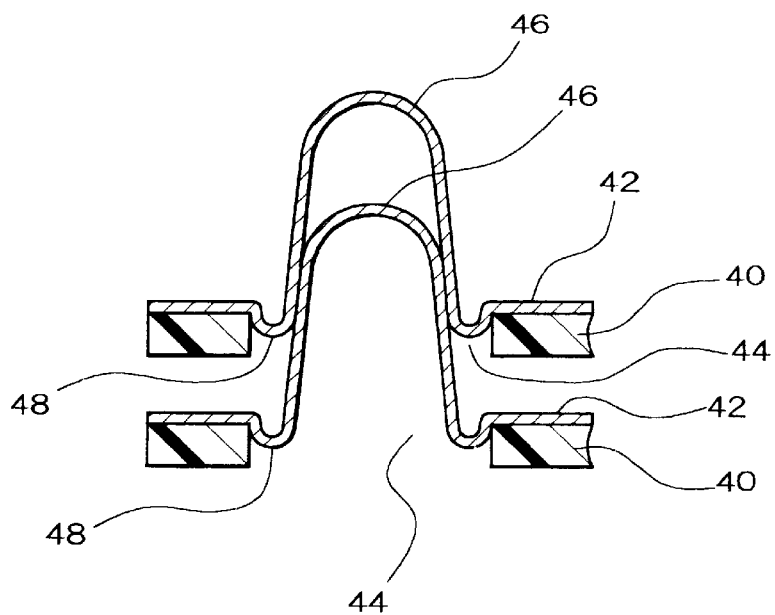
FIG. 4 shows a modification of the first embodiment.

FIG. 4 also shows a modification of this embodiment. In this modification, an interconnect pattern 42 has a bent portion 46 and a second bent portion (minor bent portion) 48 in the region of a penetrating hole 44. The bent portion 46 projects from the surface of the substrate 40 on which the interconnect pattern 42 is formed. The second bent portion 48 is formed on the periphery of the bent portion 46, and is bent in the direction opposite to the bent portion 46. The second bent portion 48 enters the penetrating hole 44. By means of this, when bent portions 46 are laid on top of each other, a stress further bending second bent portion 48 is applied from the bent portion 46. Then the resilience of the second bent portion 48 acts on the bent portion 46, and this plays the role of retaining the bent portion 46.

As shown in shown in FIG. 1, the substrates 10 are disposed so as to be superimposed. It is sufficient for the substrates 10 to overlap partially. If the substrates 10 are of the same size and shape, they may overlap completely.

In this embodiment, the two or more bent portions 16 provided on the two or more substrates 10 are stacked, and electrically connected. In more detail, the projecting surface of one bent portion 16 and the depressed surface of another bent portion 16 are facing each other, and the two bent portions 16 are electrically connected. In further detail, the projecting surface of one bent portion 16 enters into the depressed surface of another bent portion. It should be noted that the two or more bent portions 16 which are stacked one another and electrically connected may be of substantially the same shape.

For the electrical connection, it is sufficient for the metal (for example, formed by plating) formed on the surfaces of the bent portion 16 to be bonded. More specifically, metal bonds may be Au—Au, Au—Sn, solder, or the like. For the metal bond, single-point bonding may be applied, and ultrasound, heat or pressure may be applied to diffuse the materials. Furthermore, a mechanical pressure welding by means of crimping or the like may be applied.

When the semiconductor chip 20 is disposed on the side on which the bent portion 16 projects, the bent portion 16 is formed higher than the semiconductor chip 20. In more detail, in order that the depressed surface of a particular bent portion 16 can be contacted, a bent portion 16 is formed to project into the region inside that depressed surface.

According to this embodiment, the two or more interconnect patterns 12 formed on the two or more substrates 10 can be electrically connected. When the bent portions 16 are easily flexed, the bent portions 16 absorb stress, and can prevent the occurrence of breakage in the electrical connection portion.

In this embodiment, a semiconductor chip 20 is mounted on each substrate 10. On the surface of the substrate 10 on which the bent portion 16 projects is formed the interconnect pattern 12, and the semiconductor chip 20 is mounted on this surface. The semiconductor chip 20 is disposed between a pair of stacked substrates 10.

Alternatively, the semiconductor chip 20 may be mounted on the surface of the substrate 10 opposite to that on which the interconnect pattern 12 is formed. In this case, through electrical connection portions between the two surfaces of the substrate 10 (penetrating holes or via holes or the like), electrical connection of the semiconductor chip 20 and the interconnect pattern 12 is achieved.

It should be noted that of the plurality of substrates 10, at least one substrate 10 may have no semiconductor chip 20 mounted thereon.

In this embodiment, face-down mounting is applied as the mounting method. In the face-down mounting method, the semiconductor chip 20 has pads bonded to the interconnect pattern 12. Commonly, bumps are formed on the pads, but the bumps may be formed on the interconnect pattern 12. For bonding, brazing such as soldering or the like may be applied. Alternatively, a conductive paste (a resin including silver paste or the like) or a conductive adhesive or the like may be used. Alternatively, an anisotropic conductive adhesive material may be used. An anisotropic conductive adhesive material is an adhesive material which exhibits electrical conduction only in the direction in which pressure is applied, and comprises metal particles of Al or the like or resin particles which have been coated with a metal dispersed within the resin forming the adhesive. This may be an anisotropic conductive film (ACF) which is formed in a sheet form and is used by adhering to the points of adhesion, or an anisotropic conductive adhesive (ACP) which is formed in paste form, and is used by being spread on the points of adhesion.

Alternatively, an adhesive in which conductive particles are not mixed may be used. For example, using the contraction force of an insulating resin, the pads (bumps) of the semiconductor chip 20 bent portions 16 and the interconnect pattern 12 may be bonded. In this case, an adhesive in which conductive particles are not mixed will be less expensive, and therefore the semiconductor device manufacture can be achieved at lower cost.

Between the semiconductor chip 20 and the substrate 10, a resin (underfill) may be provided. When an anisotropic conductive material is used, the anisotropic conductive material may also serve as a sealing resin.

In addition to face-down mounting, a face-up type of mounting using wire bonding, or the TAB mounting method using fingers (inner leads) may be applied. On a single substrate 10, a plurality of semiconductor chips 20 may be mounted.

The semiconductor chips 20 mounted on the plurality of substrates 10 may be the same. In this case, the electrodes (pads) in the same positions on the plurality of semiconductor chips 20 mounted on the plurality of substrates 10 can be electrically connected. Then if the semiconductor chip 20 is a memory device, from one external terminal information in each memory device in the memory cell at the same address can be read out or written in. It should be noted that if each of the two semiconductor chips 20 has a respective chip select terminal, then by electrical connection to different external terminals, chip selection can be achieved. Alternatively, electrodes (pads) in the same positions on the two semiconductor chips 20 may be electrically connected to different external terminals. By inputting signals to different external terminals, chip selection is achieved.

In this embodiment, in FIG. 1, the bent portion 16 in the uppermost position is an external terminal. In more detail, of the two or more stacked bent portions 16, that having a projecting surface not disposed within the depressed surface of another bent portion 16, but having on its depressed surface the projecting surface of another bent portion 16 disposed forms an external terminal. That is to say, the semiconductor device shown in FIG. 1 is mounted on a circuit board upside down. By means of this, since the portion connecting two or more interconnect patterns 12 (the bent portion 16) is an external terminal, the number of components can be reduced.

According to this embodiment, the bent portions 16 are formed by a part of the interconnect pattern 12 projecting from the surface of the substrate 10, and have a simple construction. By means of the bent portions 16, electrical connection among the substrates 10 is achieved, and therefore there is no necessity for bumps to be formed.

This embodiment of the semiconductor device has the construction as described above, and the method of manufacture thereof is now described.

In this embodiment, a plurality of substrates 10 on which the interconnect pattern 12 is formed are taken. On at least one substrate 10 the semiconductor chip 20 is mounted. The substrates 10 are disposed so as to overlap, and two or more substrates 10 are electrically connected. It should be noted that the process of mounting the semiconductor chip 20 may be carried out before the process of electrically connecting the substrates 10, or may be carried out thereafter, or may be carried out simultaneously therewith.

The electrical connection of the substrates 10 is, that is to say, the electrical connection of the interconnect patterns 12 formed respectively thereon. The bent portion 16 provided on one substrate 10 is electrically connected to the bent portion 16 provided on another substrate 10.

Figure 5:
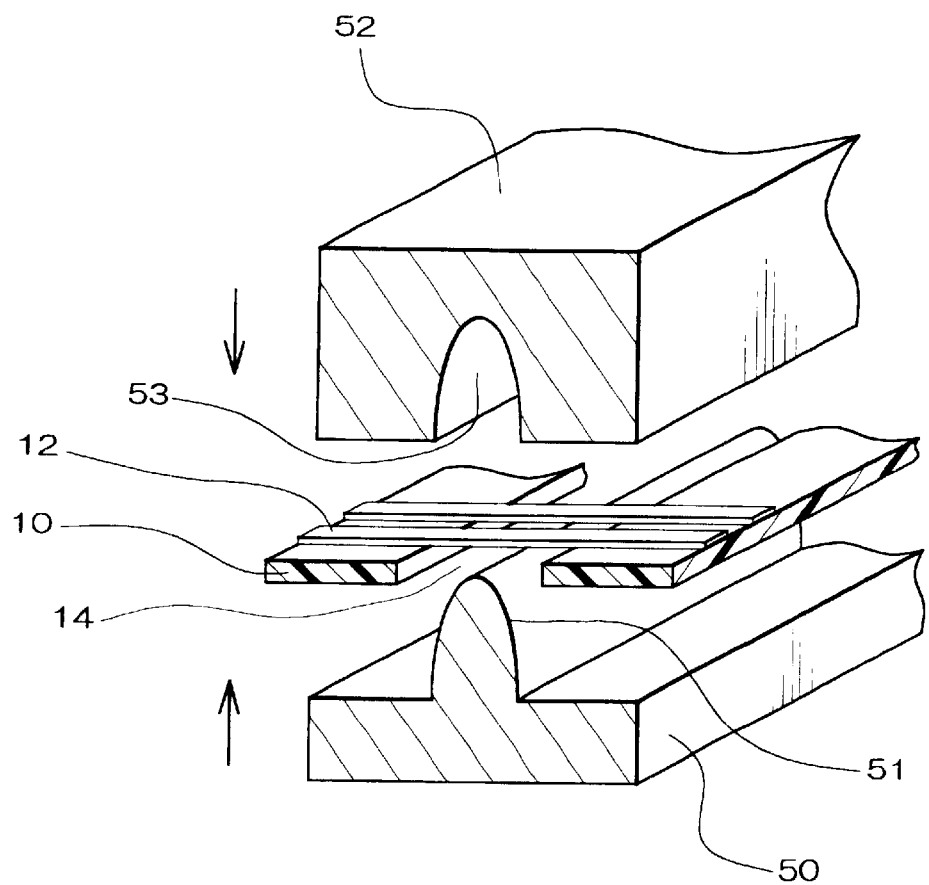
FIG. 5 shows a method of manufacturing the first embodiment of the semiconductor device to which the present invention is applied.

The method of forming the bent portions 16 is now described with reference to FIG. 5. The bent portions 16 are formed by plastic deformation of the first interconnect pattern 12. For example, the substrate 10 is positioned between a mold (for example, a metal die) 50 having a convex portion 51 of a form which is the inverse of the depressed surface of the bent portions 16 and a mold (for example, a metal die) 52 having a concave portion 53 of a form which is the inverse of the projecting surface of the bent portions 16. It should be noted that the convex portion 51 is formed of a size to pass through the penetrating holes 14. Next, by means of the molds 50 and 52, the first interconnect pattern 12 is subjected to press forming, and the bent portions 16 are formed.

Figure 6:
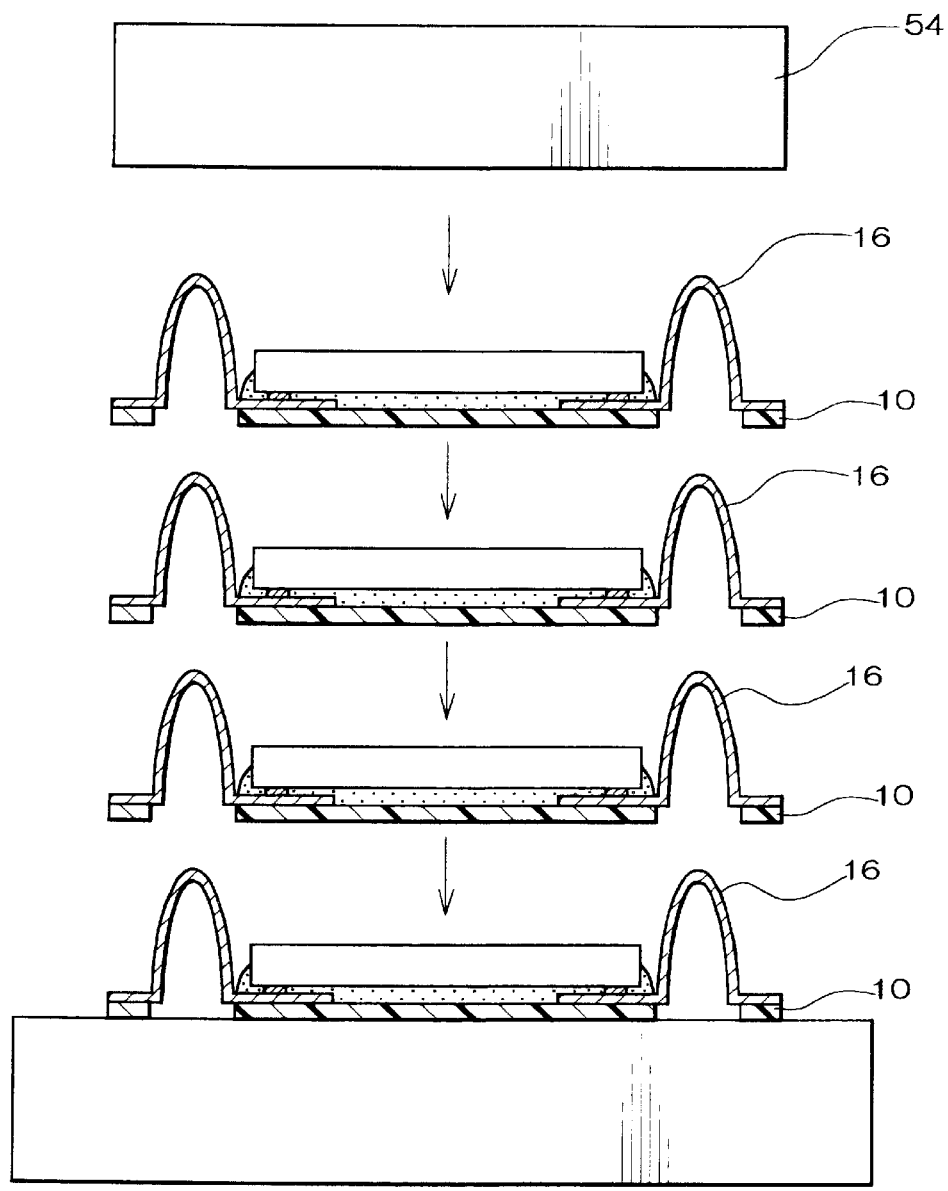
FIG. 6 shows a method of manufacturing the first embodiment of the semiconductor device to which the present invention is applied.

FIG. 6 illustrates the process of bonding the bent portions 16. In this embodiment, substrates 10 having previously formed the bent portions 16 are used. To bond the bent portions 16 together, a tool 54 may be used. For example, by means of the tool 54, at least one of pressure and heat is applied to the bent portions 16. Three or more stacked bent portions 16 may be simultaneously bonded. Moreover, when of the two or more substrates 10, the interconnect patterns 12 formed on two or more substrates 10 have bent portions 16, these bent portions 16 may be bonded simultaneously.

The bond between the bent portions 16 may be any of (1) bonding with a brazing material including solder, (2) solid diffusion bonding (metal bond) using the application of ultrasonic vibration and heat to clean surfaces, (3) bonding by mechanical crimping, and (4) adhesive conductive bonding by means of a conductive paste or the like. Whichever method is used, three or more stacked bent portions 16 can be bonded. If the same method is used for bonding the bent portions 16 together and for the electrical connection of the semiconductor chip 20 and the interconnect pattern 12, these preparatory steps are simplified.

According to this embodiment, the bent portions 16 are formed by bending a part of the first interconnect pattern 16, and therefore can be formed simply. Since the electrical connection between the substrates 10 is achieved by the bent portions 16, it is not necessary to form bumps. Within the concave part of the bent portion 16 the convex part of another bent portion 16 is inserted, whereby the positioning of the plurality of substrates 10 can be carried out.

Figure 7A:
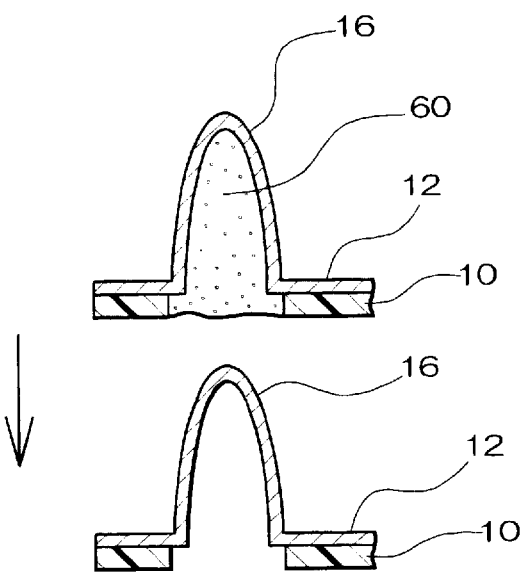
FIGS. 7A and 7B show a method of manufacturing a modification of the first embodiment of the semiconductor device.

As a modification of this embodiment, a conductive material may be provided on the bent portion. For example, in the modification shown in FIG. 7A, the interior (depression) of the depressed surface of the bent portion 16 is filled with a conductive material 60. In this case, the conductive material 60 is a material softer than the bent portion 16. For example, a conductive paste (solder paste or the like) which can be used for mounting the semiconductor chip 20 on the substrate 10, a conductive adhesive, an anisotropic conductive adhesive material, or the like can also be used here.

Figure 7B:
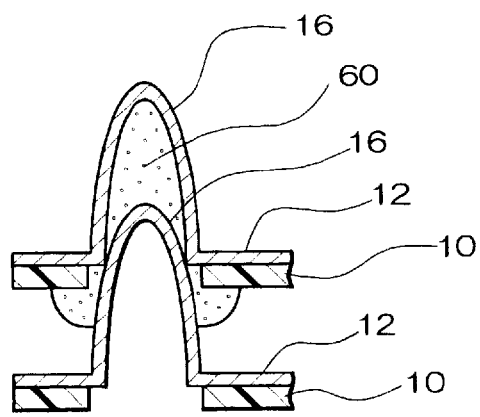

Then as shown in FIG. 7B, the projecting surface (projection) of another bent portion 16 is pressed into the conductive material 60, and the conductive material 60 is interposed between the depressed surface of one bent portion 16 and the projecting surface of another bent portion 16. In this way, a pair of bent portions 16 can be electrically connected with the conductive material 60 interposed. It should be noted that provided a short-circuit is not caused, the conductive material 60 may spread outside the depression of the bent portion 16.

Figure 8A:
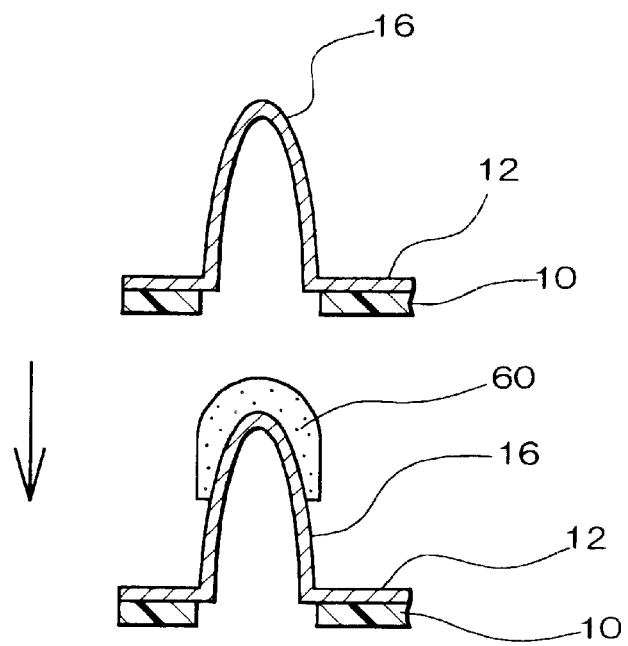
FIGS. 8A and 8B show a method of manufacturing a modification of the first embodiment of the semiconductor device.
Figure 8B:
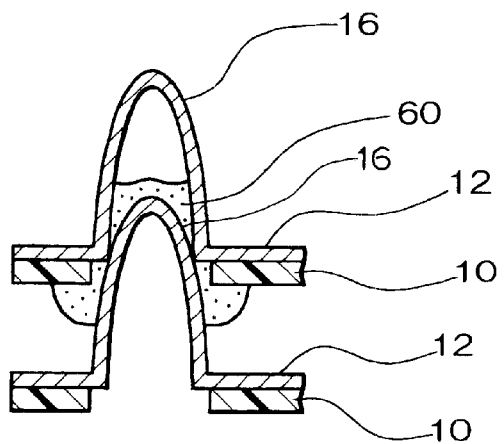

Alternatively, in the modification shown in FIG. 8A, the above described conductive material 60 is provided on the projecting surface (projection) of the bent portion 16. Then as shown in FIG. 8B, the projection of the bent portion 16 on which the conductive material 60 is provided is inserted into the depressed surface (depression) of another bent portion 16. In this way, a pair of bent portions 16 can be electrically connected with the conductive material 60 interposed. In this case also, provided a short-circuit is not caused, the conductive material 60 may spread outside the depression of the bent portion 16.

When the conductive material 60 is a thermosetting material, the adhesive force thereof can be activated by applying heat. If the step of providing the conductive material in the bonding of the semiconductor chip 20, and the step of providing the conductive material 60 for bonding the bent portions 16 are carried out simultaneously, the process can be simplified.

Alternatively, a plurality of substrates 10 not having bent portions 16 formed may be taken, and these disposed to be stacked one another, then while forming the bent portions 16 by pressing a convex die in the penetrating holes 14, so that the upper and lower bent portions 16 are electrically connected (or bonded).

Figure 9A:
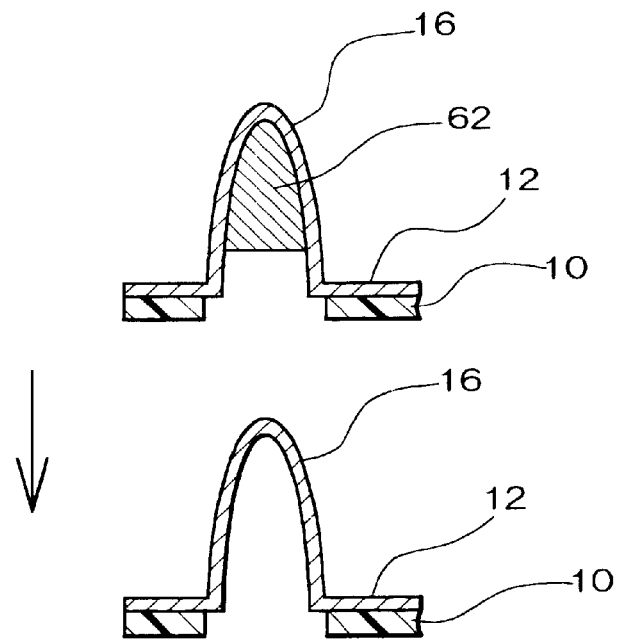
FIGS. 9A and 9B show a method of manufacturing a modification of the first embodiment of the semiconductor device.

Alternatively, in the modification shown in FIG. 9A, a conductive material 62 harder than the bent portion 16 is provided on the depressed surface (depression) of the bent portion 16. The conductive material 62 is, for example, a metal layer formed by applying plating to the depressed surface of the bent portion 16.

Figure 9B:
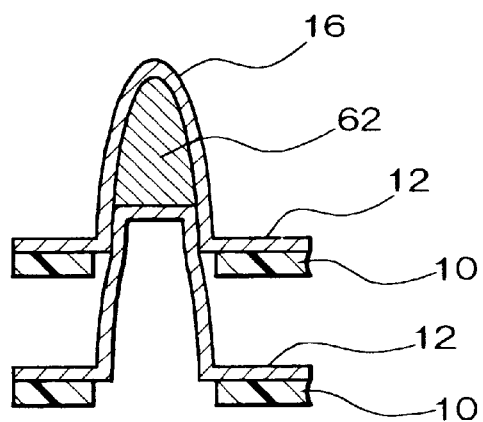

Then as shown in FIG. 9B, the projecting surface (projection) of another bent portion 16 is pressed into the conductive material 62, and this bent portion 16 is deformed into intimate contact with the conductive material 62. In this way, the pair of bent portions 16 can be electrically connected with the conductive material 62 interposed.

In this modification, when the concave portion of the bent portion 16 is filled with the hard conductive material 62, it is not possible for the projection of another bent portion 16 to enter this concave portion, and positioning of the substrates 10 using the bent portions 16 is not possible. In this case, the plurality of substrates 10 may be positioned by using their outer forms as a reference.

Figure 10:
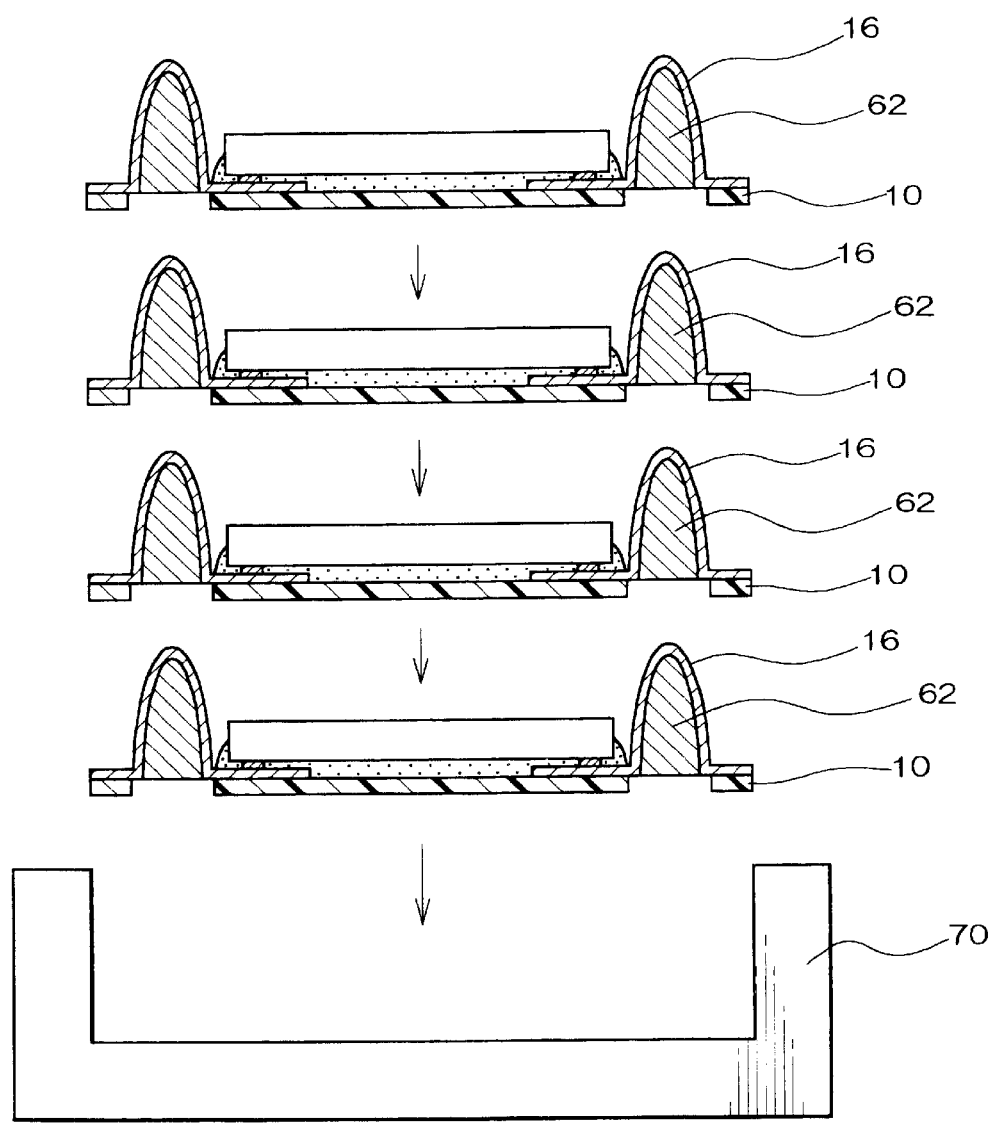
FIG. 10 shows a method of manufacturing a modification of the first embodiment of the semiconductor device.

For example, as shown in FIG. 10, a container 70 is used in which a concave portion is formed. The concave portion formed in the container 70 corresponds to the outer form of the substrate 10. In more detail, when the substrates 10 are formed with the same outer form, and are disposed so as to be entirely stacked, the inner surface of the concave portion forms a vertical surface. Therefore, when the substrates 10 are inserted within the concave portion, they are mutually positioned with reference to their outer form. Then if the bent portions 16 and flat portion 26 are also formed to be accurately positioned with respect to the outer form of the substrate 10, they will be accurately positioned. It should be noted that a part of the outer form of the substrate 10 may be used as a reference for positioning. For example, the positioning may be carried out with reference to the four corners of the substrate 10.

Figure 11:
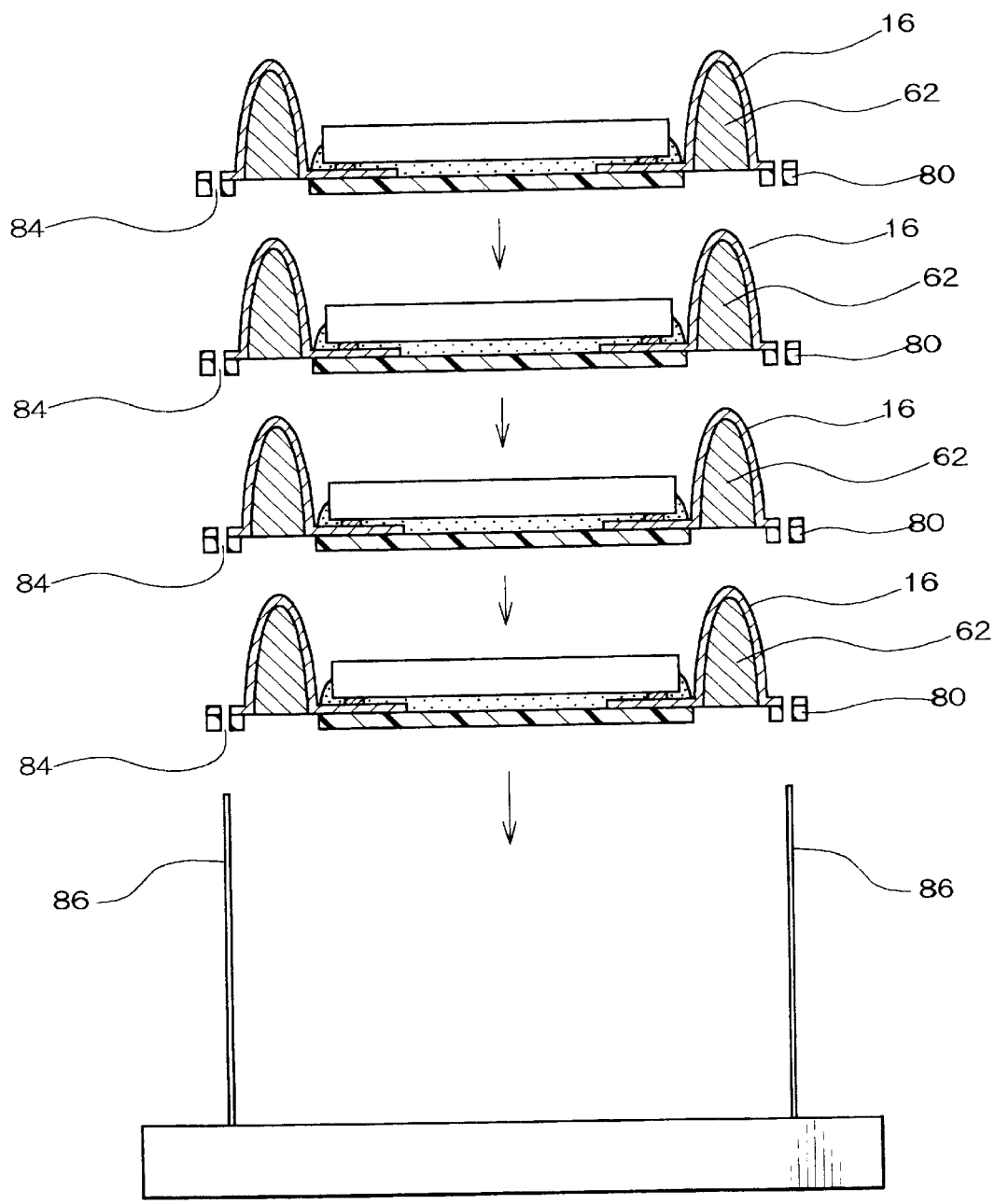
FIG. 11 shows a method of manufacturing a modification of the first embodiment of the semiconductor device.

Alternatively, as shown in FIG. 11, penetrating holes 84 may be formed in a plurality of substrates 80, and the positioning carried out with the penetrating holes 84 as reference. For example, pins 86 may be inserted in holes 84.

According to this embodiment, since bent portions 16 which can be formed simply are used, and electrical connection among the substrates 10 achieved, it is not necessary to form bumps.

Second Embodiment

Figure 12:
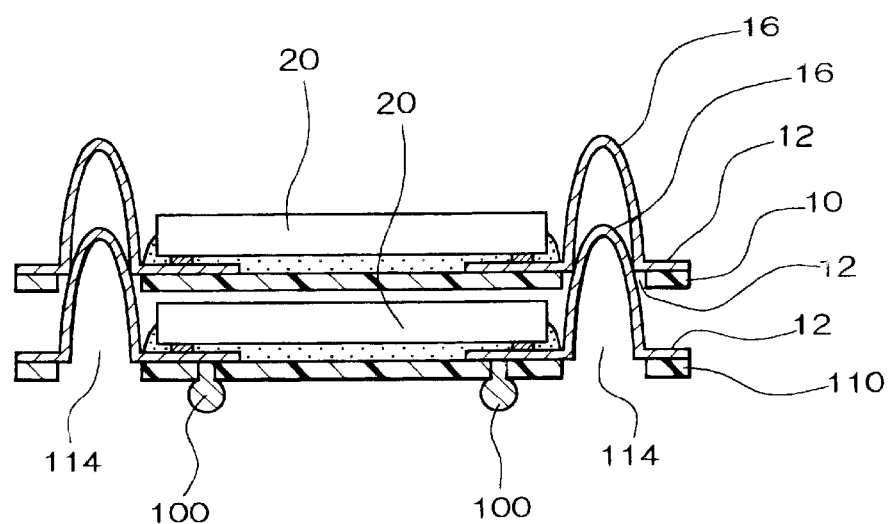
FIG. 12 shows a second embodiment of the semiconductor device to which the present invention is applied.

FIG. 12 shows a second embodiment of the semiconductor device to which the present invention is applied. This embodiment of the semiconductor device has at least one substrate 10 as described in the first embodiment, and a substrate 110. In the example shown in FIG. 12, two substrates 10 and 110 are stacked each other, but in the same way as in the example shown in FIG. 1, more than two substrates 10 and 110 may be stacked. On the substrate 110, the interconnect pattern 12 described in the first embodiment is formed, and bent portions 16 are provided over penetrating holes 114.

This embodiment of the semiconductor device has a plurality of external terminals 100. The external terminals 100 are provided on a substrate 110 positioned on the outside of the plurality of substrates 10 and 110. In more detail, the substrate 110 has the external terminals 100 projecting form the side opposite to the side on which the bent portions 16 project.

The external terminals 100 are electrically connected to the interconnect pattern 12. In more detail, penetrating holes are formed in the substrate 110, and with the penetrating holes interposed, the external terminals 100 are provided on the interconnect pattern 12. The external terminals 100 are formed of solder or the like. Solder with which the penetrating holes are filled may be melted and balls formed by surface tension, or solder balls may be mounted on conductive material provided in the penetrating holes. The inner surface of the penetrating holes may be subjected to plating to form the penetrating holes. As a modification, the two sides of the substrate 110 may be electrically connected by penetrating holes or the like, and on the surface of the substrate 110 opposite to that of the interconnect pattern 12, interconnects may be formed, and the external terminals 100 provided on this interconnect.

Alternatively, when the semiconductor device is mounted on a motherboard, a solder cream applied to the motherboard may be used, and by the surface tension when this is melted, external terminal may be formed on the interconnect pattern 12 (for example on its lands). This semiconductor device is a so-called land grid array type of semiconductor device.

Alternatively, a part of one substrate 110 may be extended beyond another substrate 110, and the external terminals formed on the extended portion. In this case, a part of the interconnect pattern 12 may be the external terminals. Alternatively, connectors to form the external terminals may be mounted on the substrate 110.

In other respects, to this embodiment may be applied the content of the description of the above first embodiment and modification thereof. In this embodiment also, the effect described in the first embodiment can be obtained.

Third Embodiment

Figure 13:
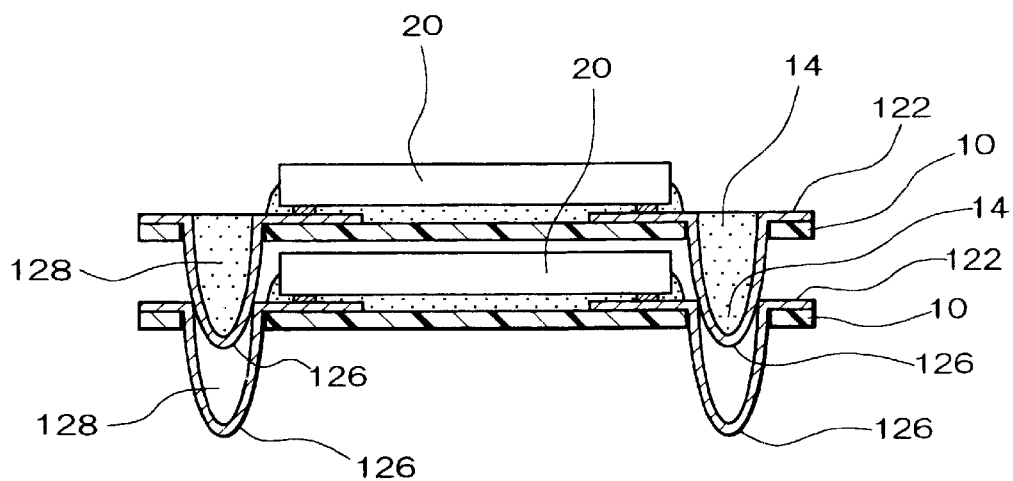
FIG. 13 shows a third embodiment of the semiconductor device to which the present invention is applied.

FIG. 13 shows a third embodiment of the semiconductor device to which the present invention is applied. This embodiment of the semiconductor device has a plurality of the substrates 10 described in the first embodiment. On the substrate 10, an interconnect pattern 122 is formed, and bent portions 126 project from the surface of the substrate 10 opposite to the surface on which the interconnect pattern 122 is formed. The bent portions 126 enter penetrating holes 14 formed in the substrate 10.

The depressed surface on particular of the bent portions 126 (in FIG. 13, the bent portions 126 disposed above) is not used for electrical connection. The concave portion of these bent portions 126 may have a resin 128 applied. By means of the resin 128, the bent portions 126 are reinforced, and deformation caused by excessive flexing of the bent portions 126 caused by stress is prevented, and stress applied to the bent portions 126 can be absorbed. By means of the resin 128, even if cracks occur in the bent portions 126, destruction of the bent portions 126 can be prevented. The resin 128 preferably fills the entire concave portion of the bent portions 126.

The resin 128 is preferably of a material that deforms to the degree of absorbing stress, but maintains a certain shape. The resin 128 is preferably well endowed with softness and with heat resistance. If a resin well endowed with softness is used, this is advantageous in the absorption of externally applied stress and thermal stress or the like by the resin.

As the resin 128 may be used, for example, polyimide resin or the like, and of these, it is preferable to use one with a low value of Young's modulus (for example an olefin polyimide resin, or as an example other than polyimide resin, BCB made by Dow Chemical, or the like). In particular it is preferable that the Young's modulus be about 300 kg/mm$^2$ or less. Alternatively, as the resin 128 may be used for example silicone denatured polyimide resin, epoxy resin, or silicone denatured epoxy resin, or the like.

In other respects, to this embodiment may be applied the content of the description of the above first embodiment and modification thereof. In this embodiment also, the effect described in the first embodiment can be obtained.

Fourth Embodiment

Figure 14:
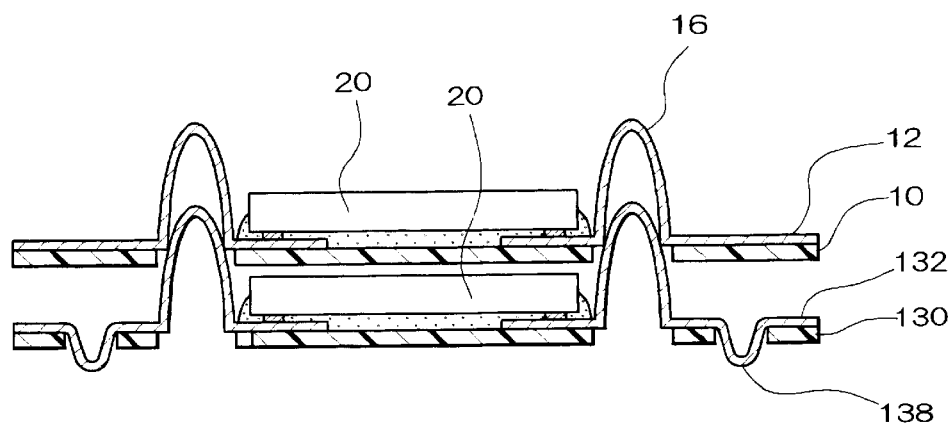
FIG. 14 shows a fourth embodiment of the semiconductor device to which the present invention is applied.

FIG. 14 shows a fourth embodiment of the semiconductor device to which the present invention is applied. This embodiment differs from the second embodiment (see FIG. 12) in the external terminals.

That is to say, in this embodiment, external terminals 138 are provided on a substrate 130. The external terminals 138 are formed by bending an interconnect pattern 132. To the external terminals 132 can be applied the content of the description of the bent portions 126 in the third embodiment (see FIG. 13).

In other respects, the content of the description of the first embodiment and modifications thereof can be applied to this embodiment. In this embodiment also, the effect described in the first embodiment can be obtained.

Fifth Embodiment

Figure 15:
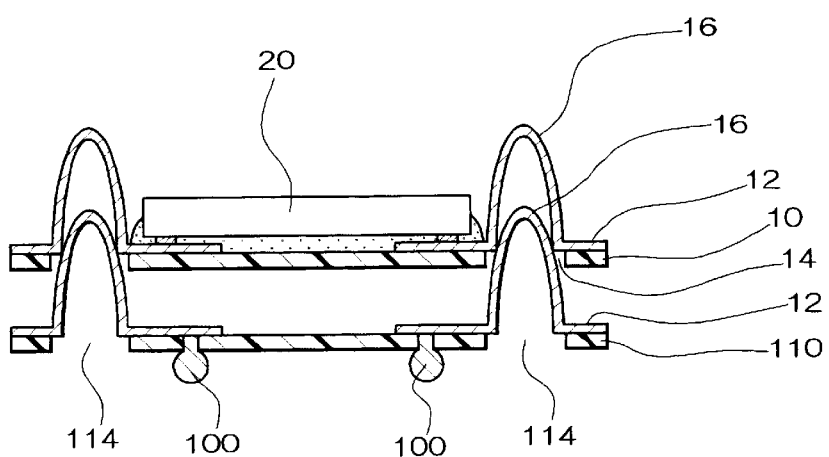
FIG. 15 shows a fifth embodiment of the semiconductor device to which the present invention is applied.

FIG. 15 shows a fifth embodiment of the semiconductor device to which the present invention is applied. This embodiment of the semiconductor device differs from the semiconductor device described in the second embodiment (see FIG. 12) in that no semiconductor chip 20 is mounted on the substrate 110.

In this case, by means of the interconnect pattern 12 formed on the substrate 110, the same construction as a multilayer interconnect is obtained. By means of this, it is not necessary to use a multilayer substrate having an expensive jumper construction, or a built-up substrate. Since no semiconductor chip is mounted on the substrate 110 on which the external terminals 100 are provided, the stress applied to the external terminals 100 is not transferred to a semiconductor chip.

The content of this embodiment can also be applied to other embodiments. In this embodiment also, the effect described in the first embodiment can be obtained.

Sixth Embodiment

Figure 16:
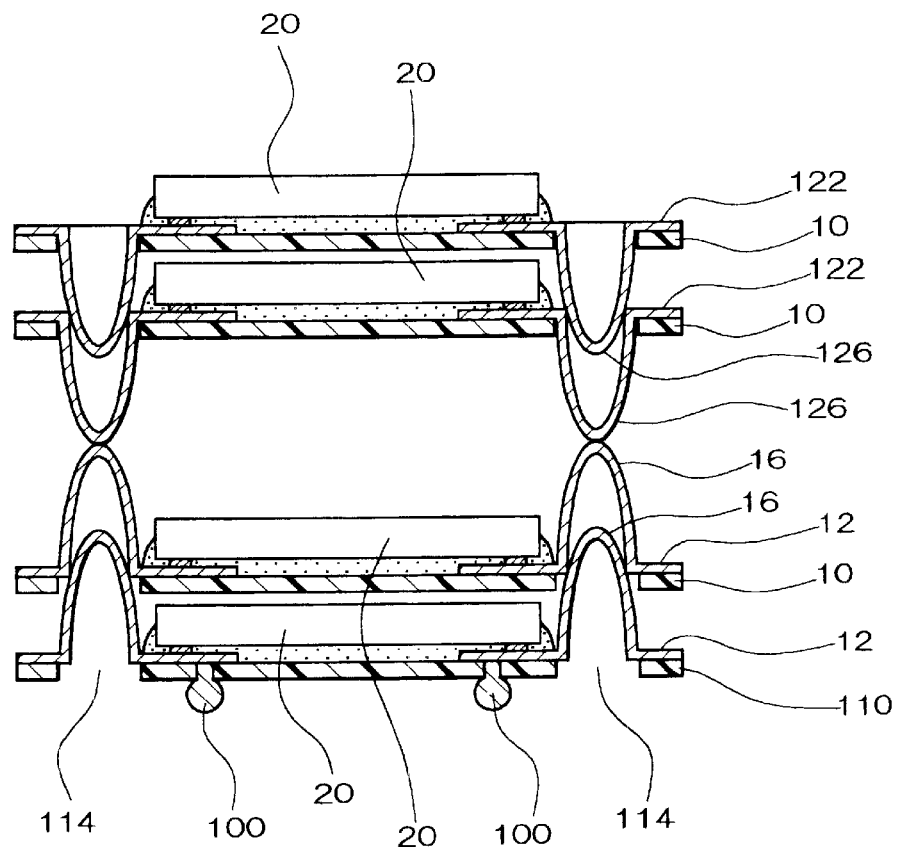
FIG. 16 shows a sixth embodiment of the semiconductor device to which the present invention is applied.

FIG. 16 shows a sixth embodiment of the semiconductor device to which the present invention is applied. In the above described embodiments, the convex and depressed surfaces of two bent portions 16 were facing each other and electrically connected, but in this embodiment of the semiconductor device, bent portions 16 and 126 have respective projecting surfaces facing each other and electrically connected. Except for the difference in the facing surfaces, the content of the electrical connection described in the first embodiment and modifications thereof applies to this embodiment.

The semiconductor device shown in FIG. 16 comprises the semiconductor device of the second embodiment (see FIG. 12) and the semiconductor device of the third embodiment (see FIG. 13). That is to say, the projection of the bent portions 16 of the semiconductor device shown in FIG. 12, and the projection of the bent portions 126 of the semiconductor device shown in FIG. 13 are electrically connected.

By means of this, the projecting sides of the bent portions 16 and 126 are facing each other, and therefore a wide gap can be obtained between the substrates 10 on which they are mounted, and it is possible to dispose a semiconductor chip of considerable thickness therebetween.

In other respects, the content of the description of the first embodiment and modifications thereof can be applied to this embodiment. In this embodiment also, the effect described in the first embodiment can be obtained.

Other Embodiments

Figure 17:
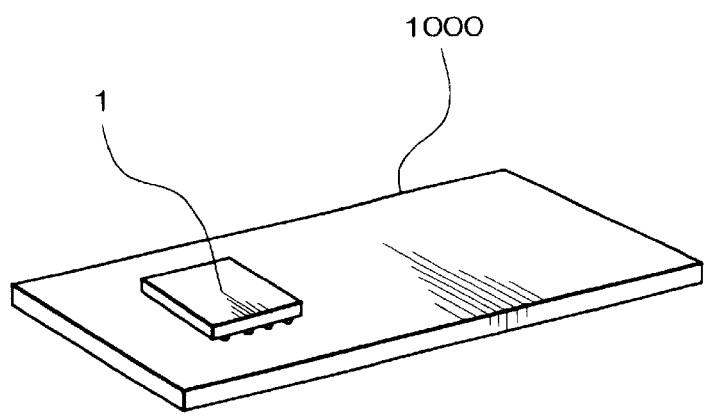
FIG. 17 shows an embodiment of a circuit board to which the present invention is applied.
Figure 18:
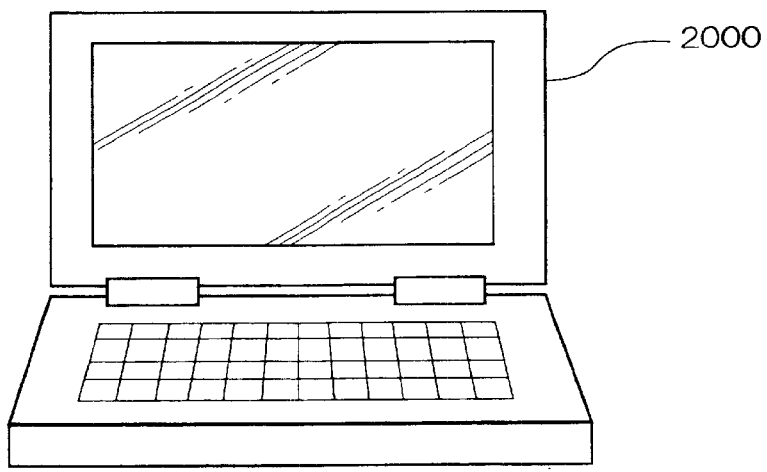
FIG. 18 shows an embodiment of an electronic instrument to which the present invention is applied.
Figure 19:
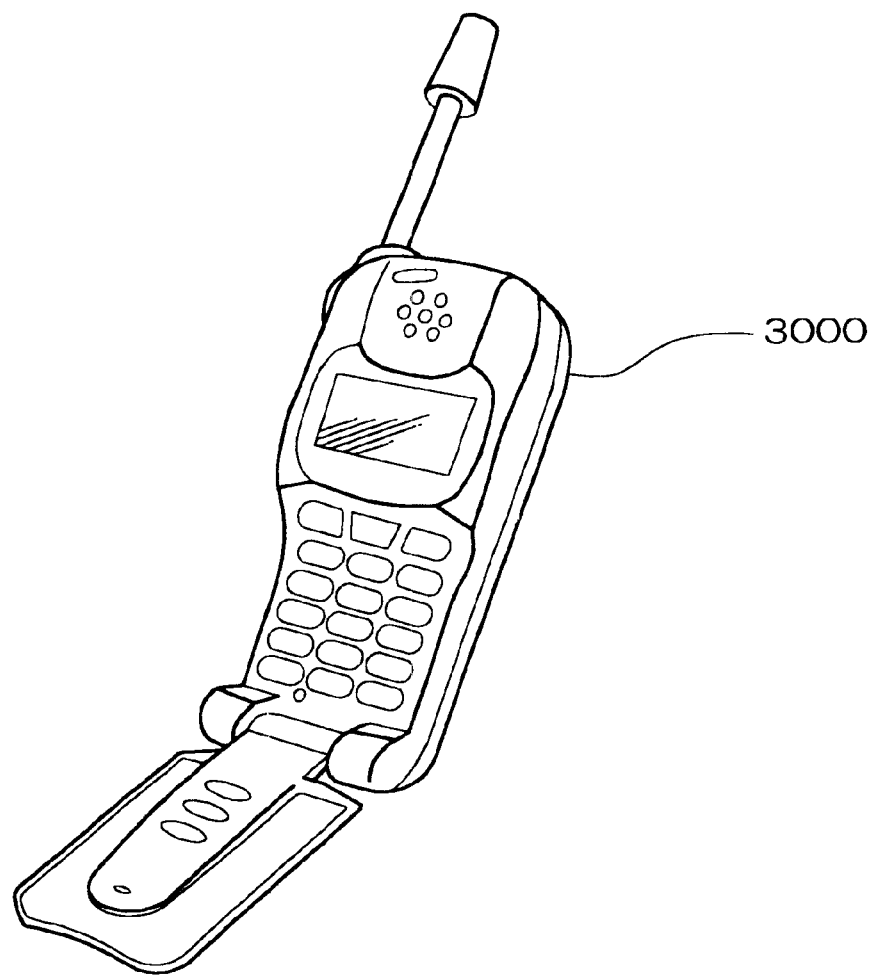
FIG. 19 shows an embodiment of an electronic instrument to which the present invention is applied.

FIG. 17 shows a circuit board 1000 on which is mounted a semiconductor device 1 manufactured by the method to which the above described embodiments relate. For the circuit board 1000 is generally used an organic substrate such as a glass epoxy substrate or the like. On the circuit board 1000, an interconnect pattern of for example copper is formed to constitute a desired circuit. Then, by mechanical connection of the interconnect pattern and the external terminals of the semiconductor device 1, electrical conduction is achieved. Then as an electronic instrument equipped with the semiconductor device 1 and circuit board 1000, in FIG. 18 is shown a notebook personal computer 2000, and in FIG. 19 is shown a mobile telephone 3000.

It should be noted that in place of the semiconductor chip used in this embodiment, an electronic element (whether an active element or a passive element) can be mounted on a first or second substrate to manufacture an electronic component. As electronic components manufactured using such an electronic element may be cited, for example, optical elements, resistors, capacitors, coils, oscillators, filters, temperature sensors, thermistors, varistors, variable resistors, and fuses.

Furthermore, in addition to a semiconductor chip, the above described electronic element may be mounted in combination on the substrate, to constitute a mounting module.

What is claimed is:

1. A semiconductor device comprising:
   a plurality of substrates disposed to be stacked one another, an interconnect pattern being formed on each of the substrates; and
   a semiconductor chip mounted on at least one of the substrates,
   wherein the interconnect pattern has a bent portion projecting from a surface of each of the substrates, and
   wherein two or more the bent portions are provided on two or more the substrates respectively, the two or more the bent portions being stacked one another and electrically connected.

2. The semiconductor device as defined in claim 1,
   wherein a projecting surface of one of the bent portions and a depressed surface of another of the bent portions are facing each other and electrically connected.

3. The semiconductor device as defined in claim 2,
   wherein the projecting surface of the one of the bent portions enters an interior of the depressed surface of the other of the bent portions.

4. The semiconductor device as defined in claim 3,
   wherein the interior of the depressed surface of the other of the bent portions is filled with a conductive material.

5. The semiconductor device as defined in claim 1,
   wherein the projecting surfaces of two of the bent portions are facing each other and electrically connected.

6. The semiconductor device as defined in claim 1,
   wherein the two or more of the bent portions, which are stacked each other and electrically connected, have substantially the same shape.

7. The semiconductor device as defined in claim 1,
   wherein a penetrating hole is formed in one of the substrates, and at least one of the bent portions enters the penetrating hole, and
   wherein the one of the bent portions entering the penetrating hole is a part of the interconnect pattern formed on the substrate having the penetrating hole.

8. The semiconductor device as defined in claim 1,
   wherein in one of the substrates, penetrating holes are formed, and at least one of the bent portions is formed over the penetrating hole without entering the penetrating hole, and
   wherein the one of the bent portions positioned over the penetrating hole is a part of the interconnect pattern formed on the substrate having the penetrating holes.

9. The semiconductor device as defined in claim 7,
   wherein two or more the bent portions are formed over the penetrating hole.

10. The semiconductor device as defined in claim 8,
    wherein two or more the bent portions are formed over the penetrating hole.

11. The semiconductor device as defined in claim 7,
    wherein two or more the penetrating holes are formed in one of the substrates,
    wherein two or more the bent portions are formed on the interconnect pattern formed on the one of the substrates having the two or more the penetrating holes, and
    wherein one of the bent portions is formed over one of the penetrating holes.

12. The semiconductor device as defined in claim 8,
    wherein two or more the penetrating holes are formed in one of the substrates,
    wherein two or more the bent portions are formed on the interconnect pattern formed on the one of the substrates having the two or more the penetrating holes, and
    wherein one of the bent portions is formed over one of the penetrating holes.

13. A circuit board on which is mounted the semiconductor device as defined in claim 1.

14. An electronic instrument having the semiconductor device as defined in claim 1.

15. A method of manufacturing a semiconductor device, comprising: mounting a semiconductor chip on at least one of a plurality of substrates, each on which an interconnect pattern is formed; disposing the substrates so as to stack one another; and electrically connecting two or more the substrates,
    wherein the interconnect pattern has a bent portion projecting from a surface of each of the substrates, and
    wherein two or more the bent portions are provided on two or more the substrates respectively, the two or more the bent portions being stacked one another and electrically connected.

16. The method of manufacturing a semiconductor device as defined in claim 15,
    wherein a projecting surface of one of the bent portions and a depressed surface of another of the bent portions are facing each other and electrically connected.

17. The method of manufacturing a semiconductor device as defined in claim 16,
    wherein the projecting surface of the one of the bent portions enters an interior of the depressed surface of the other of the bent portions.

18. The method of manufacturing a semiconductor device as defined in claim 17, further comprising:
    filling the interior of the depressed surface of the other of the bent portions with a conductive material.

19. The method of manufacturing a semiconductor device as defined in claim 18,
    wherein the projecting surfaces of two of the bent portions are facing each other and electrically connected.

20. The method of manufacturing a semiconductor device as defined in claim 15, wherein at least one of pressure and heat is applied to the stacked two or more the bent portions for electrical connection.

* * * * *